United States Patent
Heinonen et al.

(10) Patent No.: US 6,791,805 B2
(45) Date of Patent: Sep. 14, 2004

(54) CURRENT-PERPENDICULAR-TO-PLANE SPIN VALVE READER WITH REDUCED SCATTERING OF MAJORITY SPIN ELECTRONS

(75) Inventors: Olle Gunnar Heinonen, Eden Prairie, MN (US); Michael Seigler, Pittsburgh, PA (US); Eric W. Singleton, Maple Plain, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 127 days.

(21) Appl. No.: 10/113,079

(22) Filed: Apr. 1, 2002

(65) Prior Publication Data

US 2002/0186513 A1 Dec. 12, 2002

Related U.S. Application Data

(60) Provisional application No. 60/288,344, filed on May 3, 2001.

(51) Int. Cl.[7] .............................................. G11B 5/39
(52) U.S. Cl. .................................... 360/324.11; 360/314
(58) Field of Search ........................ 360/324.1, 324.11, 360/314, 324.2

(56) References Cited

U.S. PATENT DOCUMENTS

| 5,701,223 A | * | 12/1997 | Fontana et al. | ........ | 360/324.11 |
| 6,051,309 A | * | 4/2000 | Fujikata et al. | ........ | 360/324.11 |
| 6,424,506 B1 | * | 7/2002 | Saito et al. | ............ | 360/324.11 |
| 6,438,026 B2 | * | 8/2002 | Gillies et al. | ............... | 365/158 |
| 6,597,547 B1 | * | 7/2003 | Kawawake et al. | .... | 360/324.11 |
| 6,611,405 B1 | * | 8/2003 | Inomata et al. | .......... | 360/324.2 |
| 2001/0006443 A1 | * | 7/2001 | Maruyama et al. | ......... | 360/314 |
| 2002/0036872 A1 | * | 3/2002 | Hiramoto et al. | ........ | 360/324.1 |
| 2002/0054462 A1 | * | 5/2002 | Sun et al. | ................. | 360/324.2 |

* cited by examiner

Primary Examiner—Craig A. Renner
(74) Attorney, Agent, or Firm—Kinney & Lange, P.A.

(57) ABSTRACT

A giant magnetoresistive (GMR) stack configured to operate in a current-perpendicular-to-plane (CPP) mode includes a ferromagnetic free layer, at least one synthetic antiferromagnet, at least one nonmagnetic spacer layer, and at least one antiferromagnetic pinning layer. The ferromagnetic free layer has a rotatable magnetic moment. The synthetic antiferromagnet includes a ferromagnetic reference layer having a fixed magnetic moment, a ferromagnetic pinned layer having a fixed magnetic moment, and a coupling layer positioned between the reference layer and the pinned layer, wherein the coupling layer is selected from the group consisting of Cu, Ag and CuAg. The nonmagnetic spacer layer is positioned between the free layer and the synthetic antiferromagnet. The antiferromagnetic pinning layer is positioned adjacent to the synthetic antiferromagnet.

17 Claims, 2 Drawing Sheets

CURRENT-PERPENDICULAR-TO-PLANE SPIN VALVE READER WITH REDUCED SCATTERING OF MAJORITY SPIN ELECTRONS

CROSS-REFERENCE TO RELATED APPLICATION(S)

This application claims priority from Provisional Application No. 60/288,344, filed May 3, 2001 entitled "Current-Perpendicular-To-Plane (CPP) Spin Valve Readers with Cu SAF and Geometrical Stabilization" by O. Heinonen and M. Seigler.

BACKGROUND OF THE INVENTION

The present invention relates generally to a giant magnetoresistive (GMR) read sensor for use in a magnetic read head. In particular, the present invention relates to a current-perpendicular-to-plane (CPP) read sensor having an enhanced giant magnetoresistive response.

GMR read sensors are used in magnetic data storage systems to detect magnetically-encoded information stored on a magnetic data storage medium such as a magnetic disc. A time-dependent magnetic field from a magnetic medium directly modulates the resistivity of the GMR read sensor. A change in resistance of the GMR read sensor can be detected by passing a sense current through the GMR read sensor and measuring the voltage across the GMR read sensor. The resulting signal can be used to recover the encoded information from the magnetic medium.

A typical GMR read sensor configuration is the GMR spin valve, in which the GMR read sensor is a multi-layered structure formed of a nonmagnetic spacer layer positioned between a synthetic antiferromagnet (SAF) and a ferromagnetic free layer. The magnetization of the SAF is fixed, typically normal to an air bearing surface of the GMR read sensor, while the magnetization of the free layer rotates freely in response to an external magnetic field. The SAF includes a reference layer and a pinned layer which are magnetically coupled by a coupling layer such that the magnetization direction of the reference layer is opposite to the magnetization of the pinned layer. The resistance of the GMR read sensor varies as a function of an angle formed between the magnetization direction of the free layer and the magnetization direction of the reference layer. This multi-layered spin valve configuration allows for a more pronounced magnetoresistive effect, i.e. greater sensitivity and higher total change in resistance, than is possible with anisotropic magnetoresistive (AMR) read sensors, which generally consist of a single ferromagnetic layer.

A pinning layer is typically exchange coupled to the pinned layer of the SAF to fix the magnetization of the pinned layer in a predetermined direction. The pinning layer is typically formed of an antiferromagnetic material. In antiferromagnetic materials, the magnetic moments of adjacent atoms point in opposite directions and, thus, there is no net magnetic moment in the material.

An underlayer is typically used to promote the texture of the layers (including the pinning layer) consequently grown on top of it. The underlayer is chosen such that its atomic structure, or arrangement, corresponds with a desired crystallographic direction.

A seed layer is typically used to enhance the grain growth of the layers (including the underlayer) consequently grown on top of it. In particular, the seed layer provides a desired grain structure and size.

One principal concern in the performance of GMR read sensors is the $\Delta R$ (the maximum absolute change in resistance of the GMR read sensor), which directly affects the GMR ratio. The GMR ratio (the maximum absolute change in resistance of the GMR read sensor divided by the resistance of the GMR read sensor multiplied by 100%) determines the magnetoresistive effect of the GMR read sensor. Ultimately, a higher GMR ratio yields a GMR read sensor with a greater magnetoresistive effect which is capable of detecting information from a magnetic medium with a higher linear density of data.

A key determinant of the GMR ratio is the material used for the coupling layer in the SAF. The sense current that is passed through the GMR read sensor consists of majority spin electrons (spin is in the same direction of the magnetization) and minority spin electrons (spin is in the opposite direction of the magnetization). Majority spin electrons exhibit very little resistance and enhance the signal produced by the sense current, while minority spin electrons exhibit very high resistance and diminish the signal produced by the sense current. In current-in-plane (CIP) read sensors, the sense current is passed through in a direction parallel to the layers of the read sensor. In order to maximize the mean free path of the majority spin electrons and the signal produced by the sense current, the majority spin electrons should be confined to the reference layer, free layer, and the spacer layer. It is therefore desirable for the coupling layer in the SAF to reflect majority spin electrons back into the reference layer in order to prevent the majority spin electrons from passing through into the pinned layer and scattering as minority spin electrons. In CPP read sensors, however, the sense current is passed through in a direction perpendicular to the layers of the read sensor. The reflection of majority spin electrons at the reference layer/coupling layer interface acts to increase the resistance of the majority spin electrons, which has the effect of diminishing the signal produced by the sense current. It is therefore desirable for the coupling layer to allow majority spin electrons to pass through without any appreciable scattering in order to enhance the signal produced by the sense current, and ultimately increase the GMR ratio of the read sensor. It is important, however, to ensure that the magnetic coupling between the reference layer and the pinned layer is maintained in order for the read sensor to function properly.

The present invention addresses these and other needs, and offers other advantages over current devices.

BRIEF SUMMARY OF THE INVENTION

The present invention is a giant magnetoresistive (GMR) stack configured to operate in a current-perpendicular-to-plane (CPP) mode. The GMR stack includes a ferromagnetic free layer, at least one synthetic antiferromagnet (SAF), at least one nonmagnetic spacer layer, and at least one antiferromagnetic pinning layer. The ferromagnetic free layer has a rotatable magnetic moment. The SAF includes a ferromagnetic reference layer having a fixed magnetic moment, a ferromagnetic pinned layer having a fixed magnetic moment, and a coupling layer positioned between the reference layer and the pinned layer, wherein the coupling layer is selected from the group consisting of Cu, Ag and CuAg. The nonmagnetic spacer layer is positioned between the free layer and the SAF. The antiferromagnetic pinning layer is positioned adjacent to the SAF.

DETAILED DESCRIPTION

Figure 1:
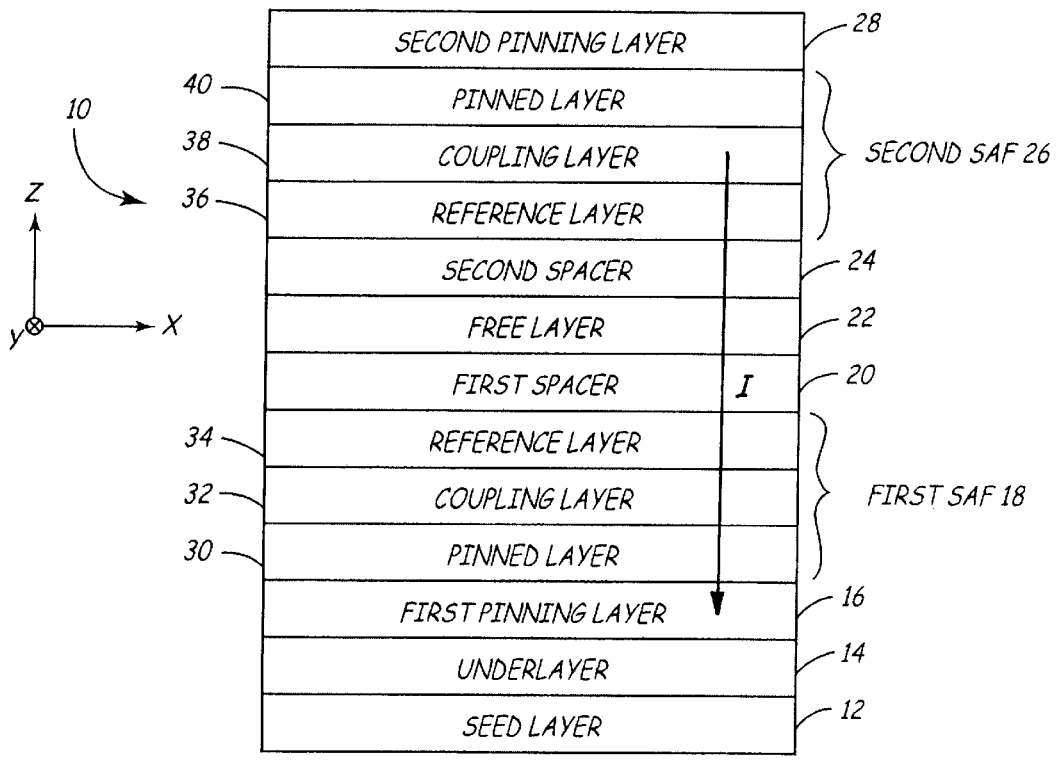
FIG. 1 is a layer diagram of a first embodiment of a spin valve of the present invention.

FIG. 1 is a layer diagram of a first embodiment of a current-perpendicular-to-plane (CPP) spin valve 10 of the present invention. Spin valve 10 is configured as a dual spin valve and includes a seed layer 12, an underlayer 14, a first pinning layer 16, a first synthetic antiferromagnet (SAF) 18, a first spacer layer 20, a free layer 22, a second spacer layer 24, a second SAF 26, and second pinning layer 28. Seed layer 12 is preferably NiFeCr or Ta. Underlayer 14 is preferably NiFe or CoFe, and is positioned adjacent to seed layer 12. First pinning layer 16 is an antiferromagnetic material, preferably selected from the group consisting of PtMn, IrMn, NiMn, NiO and FeMn, and is positioned adjacent to underlayer 14. First SAF 18 includes a ferromagnetic pinned layer 30, a ferromagnetic reference layer 34, and a coupling layer 32 positioned between pinned layer 30 and reference layer 34, and is positioned such that pinned layer 30 is adjacent to first pinning layer 16. Coupling layer 32 is preferably selected from the group consisting of Cu, Ag and CuAg, reference layer 34 is preferably CoFe, and pinned layer 30 is preferably CoFe. Free layer 22 is a ferromagnetic material, preferably CoFe or NiFe. First spacer layer 20 is a nonmagnetic material, preferably copper, and is positioned between first SAF 18 and free layer 22. Second SAF 26 includes a ferromagnetic reference layer 36, a ferromagnetic pinned layer 40, and a coupling layer 38 positioned between reference layer 36 and pinned layer 40. Reference layer 36 is preferably CoFe, coupling layer 38 is preferably selected from the group consisting of Cu, Ag and CuAg, and pinned layer 40 is preferably CoFe. Second pinning layer 28 is an antiferromagnetic material, preferably selected from the group consisting of PtMn, IrMn, NiMn, NiO and FeMn, and is positioned adjacent to pinned layer 40 of second SAF 26. Second spacer layer 24 is a nonmagnetic material, preferably copper, and is positioned between free layer 22 and second SAF 26.

The magnetizations of first and second SAFs 18 and 26 are fixed while the magnetization of free layer 22 rotates freely in response to an external magnetic field emanating from a magnetic medium. Reference layer 34 and pinned layer 30 are magnetically coupled by coupling layer 32 such that the magnetization direction of reference layer 34 is opposite to the magnetization direction of pinned layer 30. The magnetization of pinned layer 30 is pinned by exchange coupling first pinning layer 16 with pinned layer 30. Underlayer 14 promotes the crystallographic texture of the layers (including first pinning layer 16) consequently grown on top of underlayer 14. Seed layer 12 enhances the grain growth of the layers (including underlayer 14) consequently grown on top of seed layer 12. Reference layer 36 and pinned layer 40 are magnetically coupled by coupling layer 38 such that the magnetization direction of reference layer 36 is opposite to the magnetization direction of pinned layer 40. The magnetization of pinned layer 40 is pinned by exchange coupling second pinning layer 28 with pinned layer 40. The resistance of spin valve 10 varies as a function of the angles that are formed between the magnetization of free layer 22 and the magnetizations of reference layers 34 and 36.

The GMR signal produced by spin valve 10 is generated by a sense current I flowing perpendicularly through the layers of spin valve 10. Coupling layer 32 of first SAF 18 and coupling layer 38 of second SAF 26 reduce the resistance of majority spin electrons flowing through spin valve 10 by allowing majority spin electrons to pass through coupling layers 32 and 38 without any appreciable scattering. Unlike prior art coupling layers formed of ruthenium which reflect majority spin electrons and transmit minority spin electrons, coupling layers 32 and 38 instead transmit majority spin electrons and reflect minority spin electrons. In this way, coupling layers 32 and 38 enhance the GMR signal produced by spin valve 10.

The thickness of coupling layer 32 of first SAF 18 is preferably in the range of about 6 Å to about 10 Å. Within this thickness range, the optimum coupling between pinned layer 30 and reference layer 34 is achieved. Similarly, the thickness of coupling layer 38 of second SAF 26 is preferably in the range of about 6 Å to about 10 Å. Within this thickness range, the optimum coupling between reference layer 36 and pinned layer 40 is achieved.

The coupling between pinned layer 30 and reference layer 34 in first SAP 18 can be further enhanced by geometrical designs of the structure of first SAF 1S. By increasing the aspect ratios (the height perpendicular to a medium plane (in direction Y in FIG. 1, divided by the length along the medium plane (in direction X in FIG. 1) of pinned layer 30 and reference layer 34 (so that they are now greater than the aspect ratio of free layer 22), the magnetizations of pinned layer 30 and reference layer 34 will tend to align along the vertical plane (the height perpendicular to the medium plane). Because it is desirable for the magnetizations of pinned layer 30 and reference layer 34 to be aligned along the vertical plane in opposite directions, the increased aspect ratios enhance the coupling between pinned layer 30 and reference layer 34. Preferably, the aspect ratios of pinned layer 30 and reference layer 34 are about 2. In the same way, the coupling between reference layer 36 and pinned layer 40 in second SAF 26 can be further enhanced by increasing the aspect ratios of reference layer 36 and pinned layer 40.

The following table shows the calculated resistance-area (RA) product and the GMR ratio for spin valve 10, where coupling layers 32 and 38 are copper and have an 8 Å thickness. The following table also shows the calculated RA product and the GMR ratio for a prior art spin valve that is identical to spin valve 10 except coupling layers 32 and 38 are replaced with ruthenium coupling layers having an 8 Å thickness. Both spin valve 10 and the prior art spin valve include the following layers: a NiFeCr 55 Å seed layer, a NiFe 10 Å underlayer, a PtMn 150 Å first pinning layer, CoFe pinned and reference layers in the first SAF, a Cu 30 Å first spacer layer, a CoFe free layer, a Cu 30 Å second spacer layer, CoFe pinned and reference layers in the second SAF, and an IrMn 70 Å second pinning layer. For both spin valve 10 and the prior art spin valve, calculations were performed for two different thicknesses for the free layer and the pinned and reference layers in both SAFs: 30 Å and 50 Å.

| Coupling Layer | PL, RL, FL Thickness (Å) | RA Product ($\Omega \mu m^2$) | GMR Ratio (%) |
|---|---|---|---|
| Ru | 50 | 0.0627 | 3 |
| Ru | 30 | 0.0666 | 0 |
| Cu | 50 | 0.0509 | 12 |
| Cu | 30 | 0.0554 | 8.2 |

Figure 2:
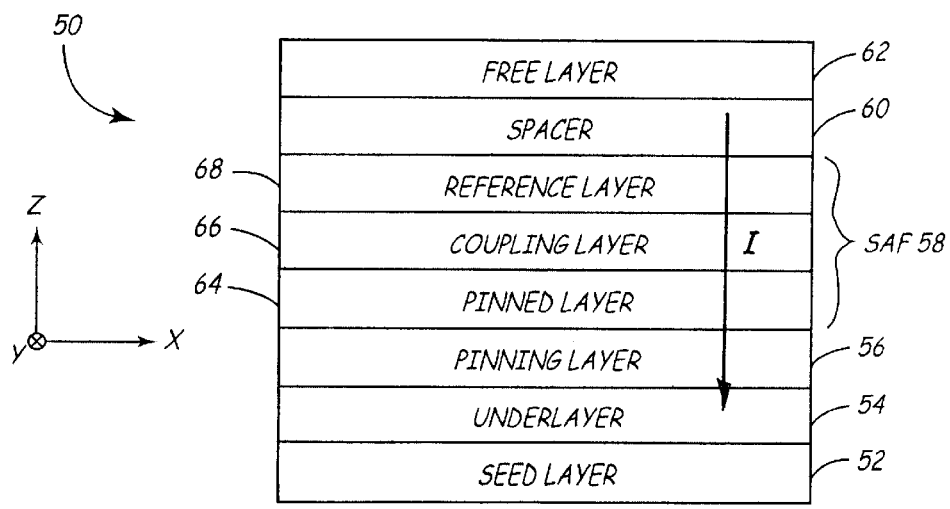
FIG. 2 is a layer diagram of a second embodiment of a spin valve of the present invention.

FIG. 2 is a layer diagram of a second embodiment of a CPP spin valve 50 of the present invention. Spin valve 50 is configured as a bottom spin valve and includes a seed layer 52, an underlayer 54, a pinning layer 56, a synthetic antiferromagnet (SAF) 58, a spacer layer 60, and a free layer 62. Seed layer 52 is preferably NiFeCr or Ta. Underlayer 54 is preferably NiFe or CoFe, and is positioned adjacent to seed layer 52. Pinning layer 56 is an antiferromagnetic material, preferably selected from the group consisting of PtMn, IrMn, NiMn, NiO and FeMn, and is positioned adjacent to underlayer 54. SAF 58 includes a ferromagnetic pinned layer 64, a ferromagnetic reference layer 68, and a coupling layer 66 positioned between pinned layer 64 and reference layer 68, and is positioned such that pinned layer 64 is adjacent to pinning layer 56. Coupling layer 66 is preferably selected from the group consisting of Cu, Ag and CuAg, reference layer 68 is preferably CoFe, and pinned layer 64 is preferably CoFe. Free layer 62 is a ferromagnetic material, preferably CoFe or NiFe. Spacer layer 60 is a nonmagnetic material, preferably copper, and is positioned between SAF 58 and free layer 62.

The magnetization of SAF 58 is fixed while the magnetization of free layer 62 rotates freely in response to an external magnetic field emanating from a magnetic medium. Reference layer 68 and pinned layer 64 are magnetically coupled by coupling layer 66 such that the magnetization direction of reference layer 68 is opposite to the magnetization direction of pinned layer 64. The magnetization of pinned layer 64 is pinned by exchange coupling pinning layer 56 with pinned layer 64. Underlayer 54 promotes the crystallographic texture of the layers (including pinning layer 56) consequently grown on top of underlayer 54. Seed layer 52 enhances the grain growth of the layers (including underlayer 54) consequently grown on top of seed layer 52. The resistance of spin valve 50 varies as a function of an angle that is formed between the magnetization of free layer 62 and the magnetization of reference layer 68.

The GMR signal produced by spin valve 50 is generated by a sense current I flowing perpendicularly through the layers of spin valve 50. Coupling layer 66 of SAF 58 reduces the resistance of majority spin electrons flowing through spin valve 50 by allowing majority spin electrons to pass through coupling layer 50 without any appreciable scattering. Unlike prior art coupling layers formed of ruthenium which reflect majority spin electrons and transmit minority spin electrons, coupling layer 66 instead transmits majority spin electrons and reflects minority spin electrons. In this way, coupling layer 66 enhances the GMR signal produced by spin valve 50.

The thickness of coupling layer 66 of SAF 58 is preferably in the range of about 6 Å to about 10 Å. Within this thickness range, the optimum coupling between pinned layer 64 and reference layer 68 is achieved. The coupling between pinned layer 64 and reference layer 68 in SAP 58 can be further enhanced by geometrical designs of the structure of SAF 58. By increasing the aspect ratios (the height perpendicular to a medium plane (in direction Y in FIG. 2) divided by the length along the medium plane (in direction X in FIG. 2)) of pinned layer 64 and reference layer 68 (so that they are now greater than the aspect ratio of free layer 62), the magnetizations of pinned layer 64 and reference layer 68 will tend to align along the vertical plane (the height perpendicular to the medium plane). Because it is desirable for the magnetizations of pinned layer 64 and reference layer 68 to be aligned along the vertical plane in opposite directions, the increased aspect ratios enhance the coupling between pinned layer 64 and reference layer 68. Preferably, the aspect ratios of pinned layer 64 and reference layer 68 are about 2.

Figure 3:
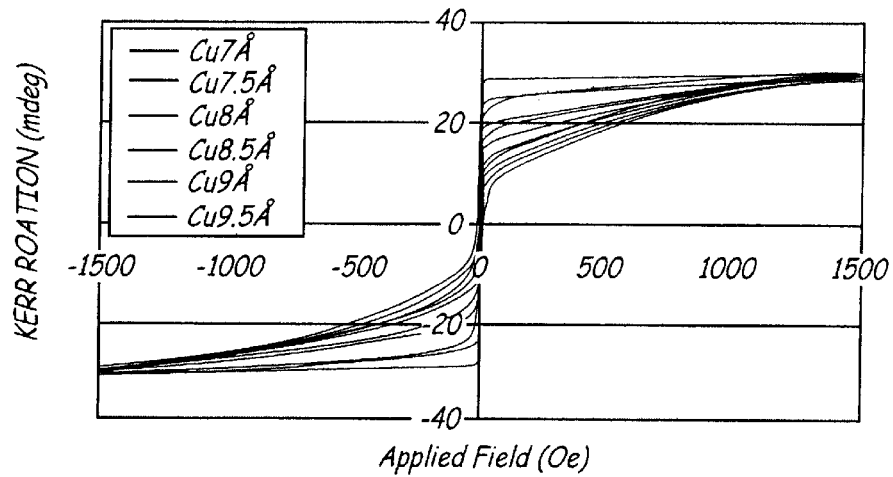
FIG. 3 is a graph of the Kerr rotation of a synthetic antiferromagnet portion of the present invention.

FIG. 3 is a graph of the Kerr rotation of a synthetic antiferromagnet (SAF) portion of the present invention. The SAF includes a CoFe 50 Å pinned layer, a Cu coupling layer, and a CoFe 50 Å reference layer. The graph shows the Kerr rotation (mdeg) for various coupling layer thicknesses as a function of an applied magnetic field (Oe). The optimum coupling is achieved when the coupling layer thickness is in the range of about 8 Å to about 9 Å.

Figure 4:
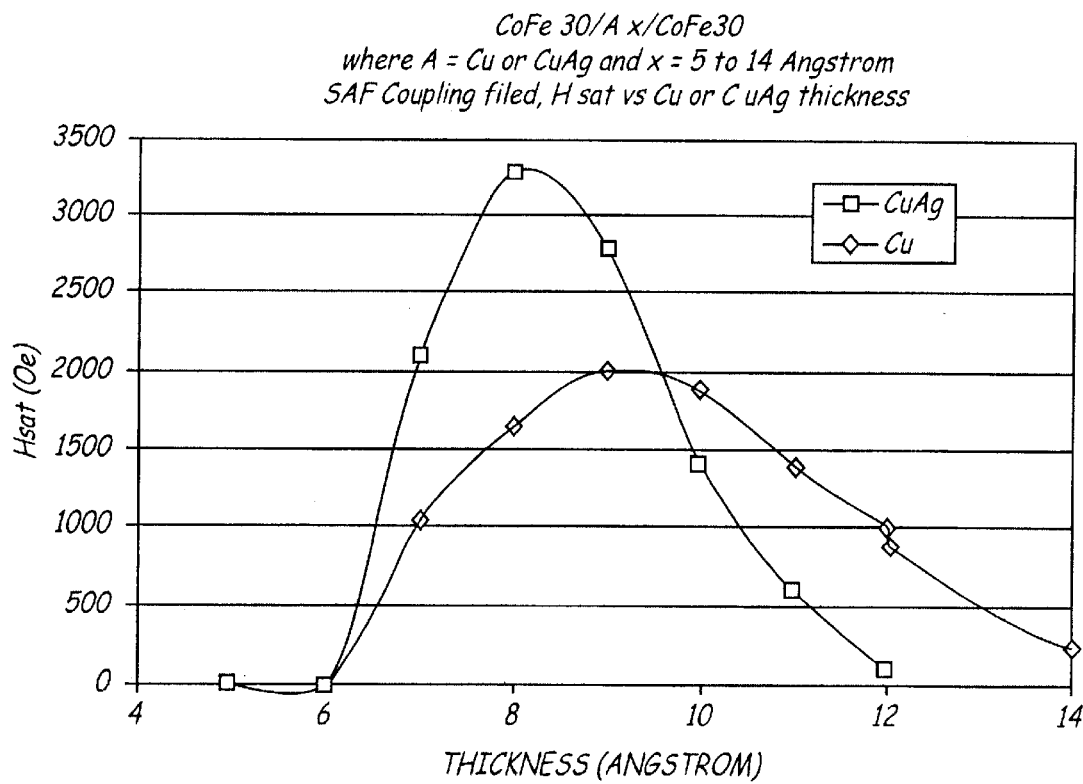
FIG. 4 is a graph of the coupling field of a synthetic antiferromagnet portion of the present invention.

FIG. 4 is a graph of the coupling field of a synthetic antiferromagnet (SAF) portion of the present invention. The SAF includes a 30 Å pinned layer, a Cu or CuAg coupling layer, and a 30 Å reference layer. The graph shows the coupling field (Oe) for both a Cu coupling layer and a CuAg coupling layer as a function of coupling layer thickness (Å). The optimum coupling is achieved when the coupling layer thickness is in the range of about 7 Å to about 10 Å.

Although the present invention has been described with reference to preferred embodiments, workers skilled in the art will recognize that changes may be made in form and detail without departing from the spirit and scope of the invention.

What is claimed is:

1. A device comprising:
   a multilayer stack having a synthetic antiferromagnet, a conductive nonmagnetic metal spacer adjacent the synthetic antiferromanet, and a ferromagnetic free layer adjacent the spacer, the multilayer stack configured to operate in a current-perpendicular-to-plane (CPP) mode wherein a sense current flows substantially perpendicular to a longitudinal plane of the synthetic antiferromagnet; and
   means for reducing scattering of majority spin electrons traveling through the synthetic antiferromagnet.

2. The device of claim 1 wherein the synthetic antiferromagnet includes an interface between a reference layer and a coupling layer, and wherein the means for reducing scattering of majority spin electrons reduces reflection of majority spin electrons at the interface.

3. The device of claim 2 wherein the means for reducing scattering of majority spin electrons includes a copper coupling layer.

4. The device of claim 3 wherein the copper coupling layer has a thickness in a range of about 6 Å to about 10 Å.

5. The device of claim 2 wherein the means for reducing scattering of majority spin electrons includes a silver coupling layer.

6. The device of claim 5 wherein the silver coupling layer has a thickness in a range of about 6 Å to about 10 Å.

7. The device of claim 2 wherein the means for reducing scattering of majority spin electrons includes a CuAg coupling layer.

8. The device of claim 1 wherein the means for reducing scattering of majority spin electrons increases a GMR ratio of the multilayer stack by about a factor of 4.

9. The device of claim 1 wherein the means for reducing scattering of majority spin electrons causes the multilayer stack to exhibit a GMR ratio of at least 12%.

10. A device configured to operate in a current-perpendicular-to-plane (CPP) mode, the device having a plurality of layers including:
    a ferromagnetic free layer;
    a conductive nonmagnetic metal spacer layer positioned adjacent the free layer;
    a ferromagnetic reference layer having a fixed magnetic moment and positioned adjacent to the nonmagnetic metal spacer layer;

a ferromagnetic pinned layer having a fixed magnetic moment;

a coupling layer positioned between the reference layer and the pinned layer, wherein the coupling layer reduces scattering of majority spin electrons; and wherein a sense current flows substantially perpendicular to a longitudinal plane of the plurality of layers.

11. The device of claim 10 wherein the coupling layer is selected from the group consisting of Cu, Ag and CuAg.

12. The device of claim 11 wherein the coupling layer has a thickness in a range of about 6 Å to about 10 Å.

13. A device configured to operate in a current-perpendicular-to-plane (CPP) mode, the device comprising:

a ferromagnetic free layer having a rotatable magnetic moment;

a first synthetic antiferromagnet comprising:
  a ferromagnetic reference layer having a fixed magnetic moment;
  a ferromagnetic pinned layer having a fixed magnetic moment; and
  a coupling layer positioned between the reference layer and the pinned layer,
    wherein the coupling layer is selected from the group consisting of Cu, Ag and CuAg;

a first conductive nonmagnetic metal spacer layer positioned between the free layer and the first synthetic antiferromagnet;

a first antiferromagnetic pinning layer positioned adjacent to the first synthetic antiferromagnet; and wherein a sense current flows substantially perpendicular to a longitudinal plane of the first synthetic antiferromagnet.

14. The device of claim 13 wherein the coupling layer of the first synthetic antiferromagnet has a thickness in a range of about 6 Å to about 10 Å.

15. The device of claim 13 and further comprising:

a second synthetic antiferromagnet comprising:
  a ferromagnetic reference layer having a fixed magnetic moment;
  a ferromagnetic pinned layer having a fixed magnetic moment; and
  a coupling layer positioned between the reference layer and the pinned layer of the second synthetic antiferromagnet, wherein the coupling layer of the second synthetic antiferromagnet is selected from the group consisting of Cu, Ag and CuAg;

a second nonmagnetic metal spacer layer positioned between the free layer and the second synthetic antiferromagnet; and a second antiferromagnetic pinning layer positioned adjacent to the second synthetic antiferromagnet.

16. The device of claim 15 wherein the coupling layer of the second synthetic antiferromagnet has a thickness in a range of about 6 Å to about 10 Å.

17. A read sensor for use in a magnetic read head, the read sensor comprising:

a giant magnetoresistive (GMR) stack having a synthetic antiferromagnet, the GMR stack configured to operate in a current-perpendicular-to-plane (CPP) mode wherein a sense current flows substantially perpendicular to a longitudinal plane of the synthetic antiferromagnet; and means for reducing scattering of majority spin electrons traveling through the synthetic antiferromagnet including a CuAg coupling layer.

* * * * *

UNITED STATES PATENT AND TRADEMARK OFFICE
CERTIFICATE OF CORRECTION

PATENT NO. : 6,791,805 B2
DATED : September 14, 2004
INVENTOR(S) : Olle Gunnar Heinonen et al.

It is certified that error appears in the above-identified patent and that said Letters Patent is hereby corrected as shown below:

Column 1,
Line 39, delete "freelyin", insert -- freely in --

Column 4,
Line 20, delete "SAP", insert -- SAF --
Line 21, delete "1S", insert -- 18 --

Column 6,
Line 55, delete "multilaver", insert -- multilayer --

Signed and Sealed this

Fifth Day of July, 2005

JON W. DUDAS
*Director of the United States Patent and Trademark Office*